US012646689B2

(12) United States Patent
    Satake et al.

(10) Patent No.:    US 12,646,689 B2
(45) Date of Patent:      Jun. 2, 2026

(54) PLASMA PROCESSING METHOD

(71) Applicant: Hitachi High-Tech Corporation, Tokyo (JP)

(72) Inventors: Makoto Satake, Tokyo (JP); Takashi Shiota, Tokyo (JP); Taku Iwase, Tokyo (JP); Yasushi Sonoda, Tokyo (JP); Michikazu Morimoto, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 18/279,509

(22) PCT Filed: Oct. 11, 2022

(86) PCT No.: PCT/JP2022/037800
    § 371 (c)(1),
    (2) Date: Aug. 30, 2023

(87) PCT Pub. No.: WO2024/079776
    PCT Pub. Date: Apr. 18, 2024

(65)          Prior Publication Data
    US 2025/0239437 A1     Jul. 24, 2025

(51) Int. Cl.
    *H01J 37/32*        (2006.01)
(52) U.S. Cl.
    CPC .. *H01J 37/32449* (2013.01); *H01J 37/32146* (2013.01); *H01J 2237/3341* (2013.01)
(58) Field of Classification Search
    CPC .................... H01L 21/02315; H01L 21/0234
    See application file for complete search history.

(56)          References Cited

U.S. PATENT DOCUMENTS

| | | | |
|---|---|---|---|
| 6,461,972 | B1 | 10/2002 | Kabansky |
| 2005/0064701 | A1 | 3/2005 | Dalton et al. |

(Continued)

FOREIGN PATENT DOCUMENTS

| | | |
|---|---|---|
| JP | H06-252108 A | 9/1994 |
| JP | 2003-047278 A | 12/2003 |

(Continued)

OTHER PUBLICATIONS

Search Report mailed Jan. 10, 2023 in International Application No. PCT/JP2022/037800.

(Continued)

*Primary Examiner* — Binh X Tran
(74) *Attorney, Agent, or Firm* — Miles & Stockbridge, P.C.

(57)            ABSTRACT

The invention provides a plasma processing method capable of constructing a self-limited process excellent in mass productivity in a cycle etching method in which an adsorption step of forming a reaction layer on a surface of an etching target wafer and a desorption step of removing the formed reaction layer using a rare gas in a metastable state are repeated. The plasma processing method includes: an adsorption step of forming a reaction layer on an etching target film by plasma generated using a reactive gas; and a desorption step of removing the reaction layer using the rare gas in the metastable state generated by the plasma. The adsorption step and the desorption step are repeated, and a pressure of the adsorption step is higher than a pressure of the desorption step.

20 Claims, 7 Drawing Sheets

(56) References Cited

U.S. PATENT DOCUMENTS

| | | | |
|---|---|---|---|
| 2013/0023125 A1 | 1/2013 | Singh | |
| 2014/0206192 A1 | 7/2014 | Yeom et al. | |
| 2014/0308815 A1* | 10/2014 | Dokan | H01L 21/0337 |
| | | | 438/714 |
| 2015/0064922 A1 | 3/2015 | Kitamura et al. | |
| 2016/0079073 A1* | 3/2016 | Matsui | H01L 21/30621 |
| | | | 438/694 |
| 2021/0130955 A1* | 5/2021 | Nagaike | C23C 16/505 |
| 2022/0254649 A1* | 8/2022 | Tan | H01L 21/02057 |

FOREIGN PATENT DOCUMENTS

| | | |
|---|---|---|
| JP | 2005-244244 A | 9/2005 |
| JP | 2006-523379 A | 10/2006 |
| JP | 2013-214584 A | 10/2013 |
| JP | 2014-007432 A | 1/2014 |
| JP | 2015-065393 A | 4/2015 |
| JP | 2016-058590 A | 4/2016 |
| JP | 2017-228791 A | 12/2017 |
| JP | 2020-017697 A | 1/2020 |

OTHER PUBLICATIONS

Office Action mailed Jul. 13, 2016 in U.S. Appl. No. 14/625,909.
Office Action mailed Jan. 29, 2016 in U.S. Appl. No. 14/625,909.
H.J. Yun, et al. Comparison of Atomic Scale Etching of Poly-Si in Inductively Coupled Ar and He Plasma, Korean J. Chem. Eng. vol. 24, year 2007, pp. 670-673.
N. Marchack et al., "Perspective in Nanoscale Plasma Etching", J. Phys. D: Appl. Phys. vol. 44, year 2011, pp. 174011-1 to 174011-11.
Athavale, Salish D., et al., "Realization of atomic layer etching of silicon", Journal of Vacuum Science and Technology B, vol. 14, No. 6, pp. 3702-3705, (1996).

* cited by examiner

[FIG. 4]
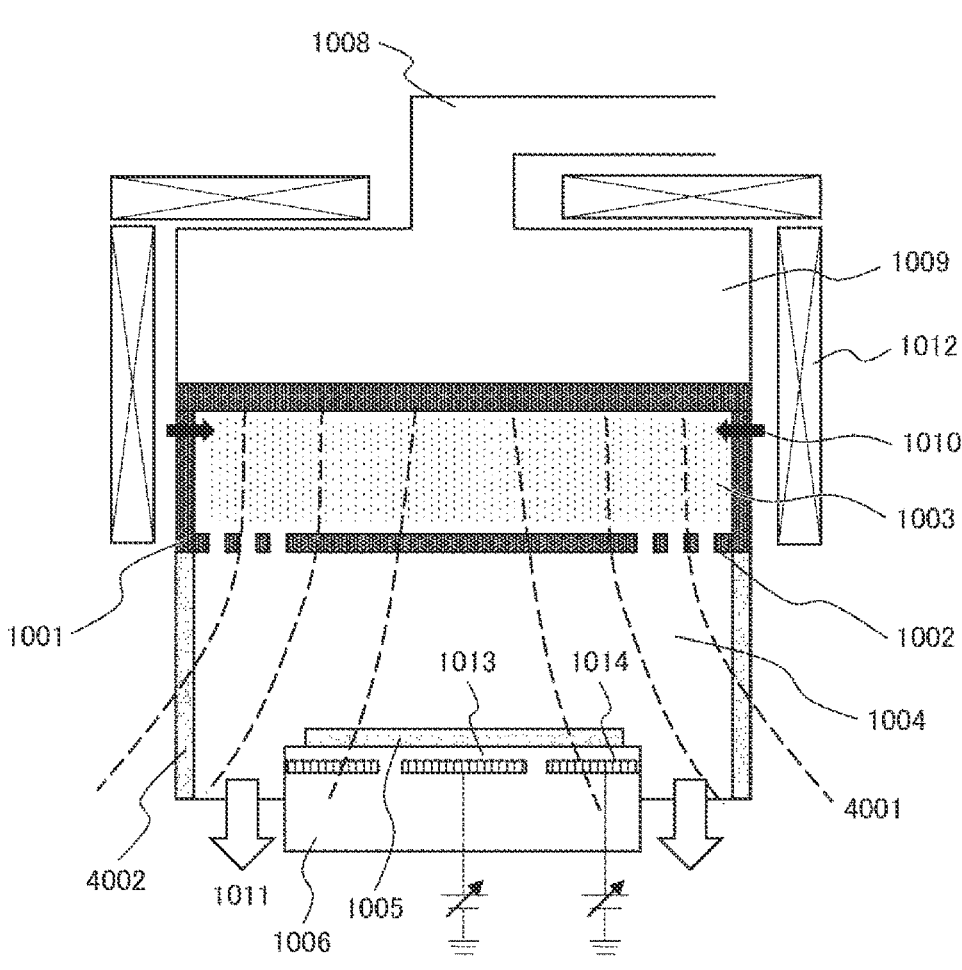

[FIG. 5]
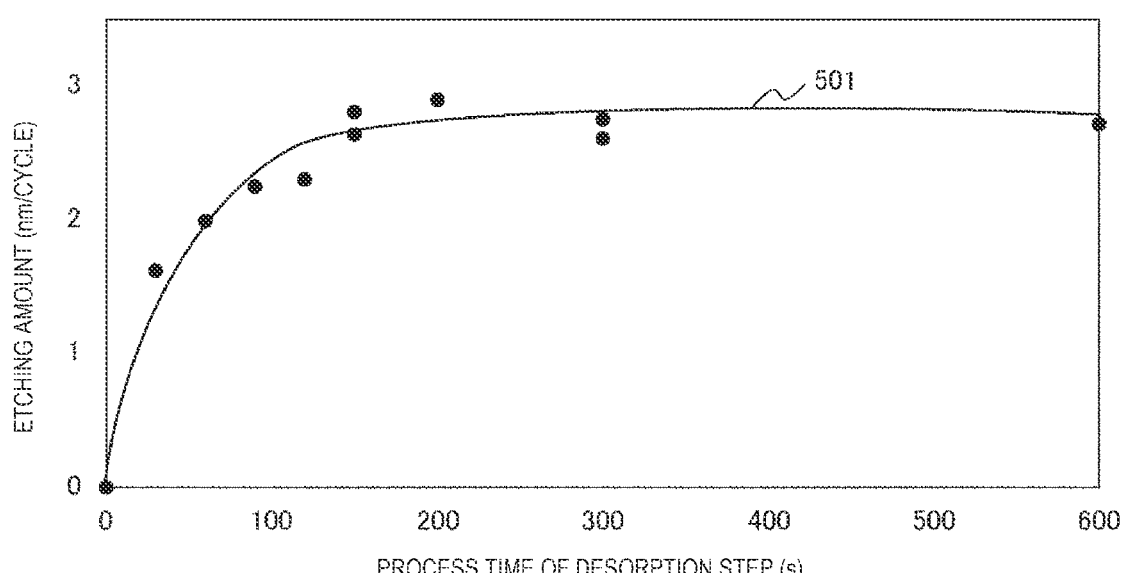
[FIG. 6]
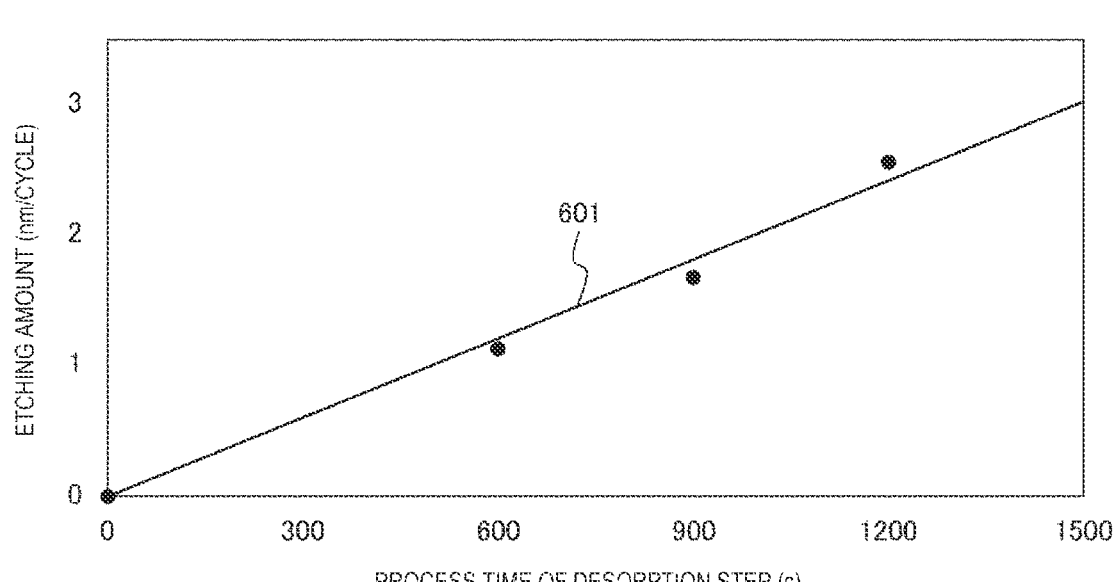

[FIG. 7]
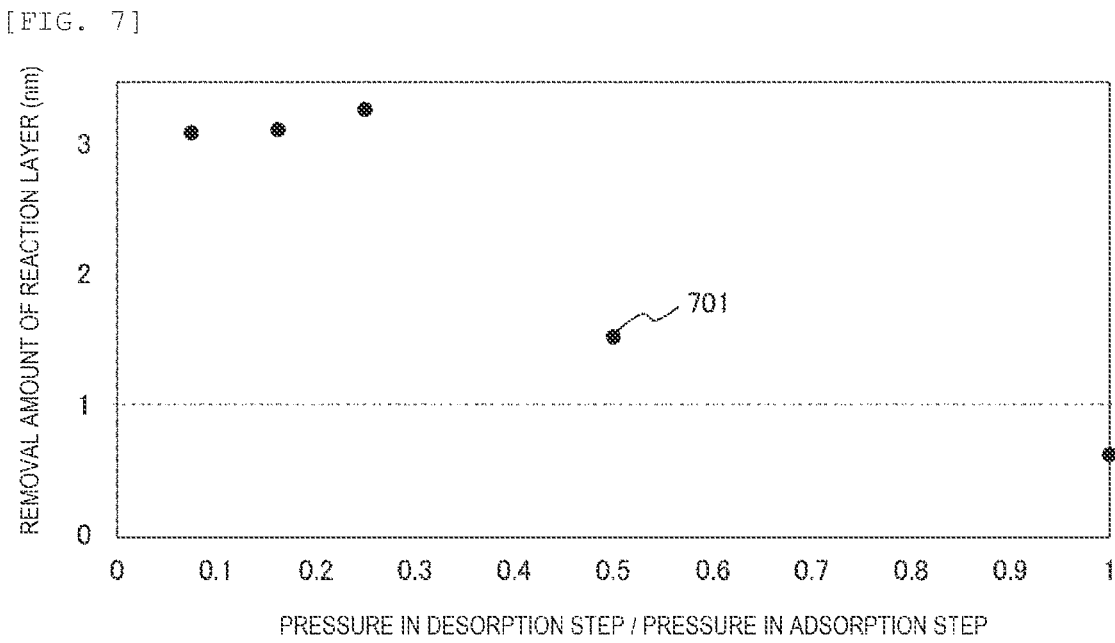
[FIG. 8]
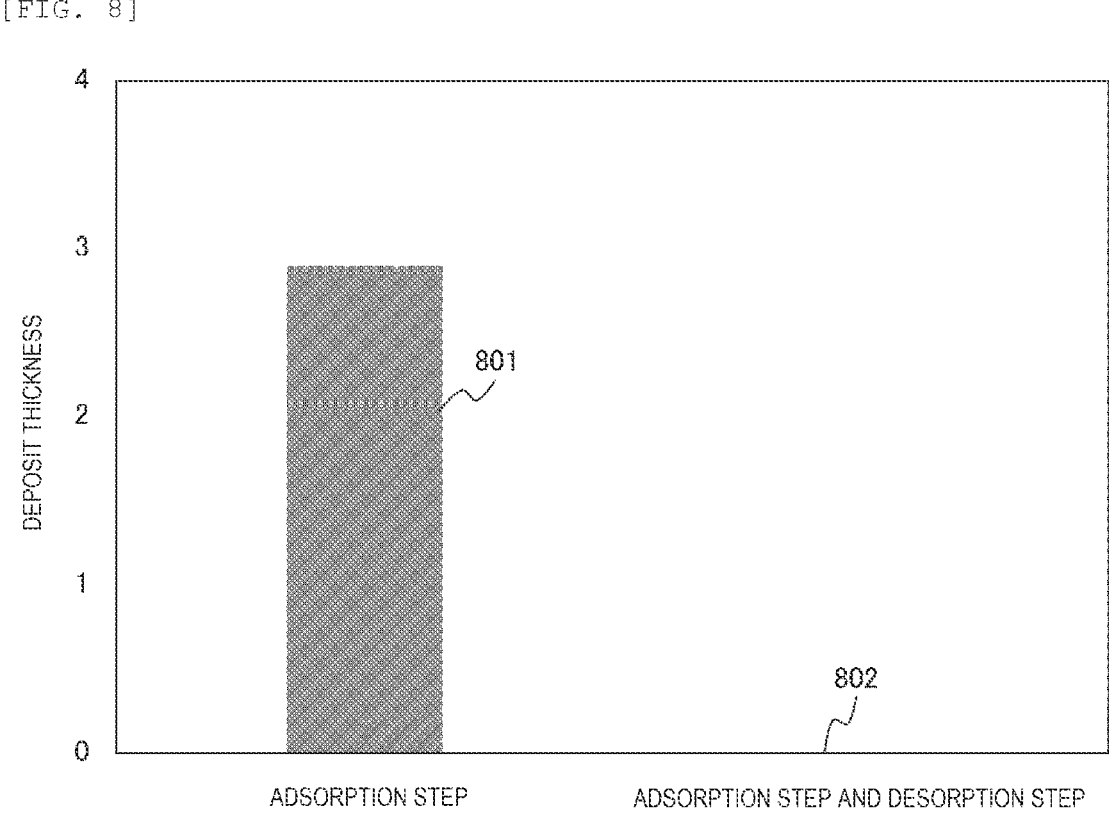

[FIG. 9]

| | | SiN ETCHING AMOUNT |
|---|---|---|
| 901 | INTERRUPT GENERATION OF PLASMA | 2.35 nm/CYCLE |
| 902 | MAINTAIN GENERATION OF PLASMA | 2.38 nm/CYCLE |

903

PLASMA PROCESSING METHOD

TECHNICAL FIELD

The present invention relates to a high-accuracy plasma processing method excellent in mass productivity.

BACKGROUND ART

In semiconductor devices, further miniaturization and three-dimensionalization of device structure have been advanced due to demands for power consumption reduction and storage capacity increase. In manufacturing a device having a three-dimensional structure, since the structure is steric and complicated, in addition to "vertical etching" in which etching is performed in a vertical direction with respect to a wafer surface in the related art, "isotropic etching", which is capable of etching also in a lateral direction with respect to the wafer surface, is frequently used.

In the related art; isotropic etching by wet processing using a chemical solution is studied. However, with progress of the miniaturization, a problem such as pattern collapse due to the surface tension of the chemical solution becomes obvious. Therefore, studies are made to replace the wet processing in the related art with dry processing, which does not use a chemical solution.

As a technique for performing isotropic etching with high accuracy by dry processing, a cycle etching method is known in which an adsorption step of forming a reaction layer on a surface of an etching target wafer and a desorption step of removing the formed reaction layer are repeated. As such a cycle etching method, PTL 1 describes a processing method including: an adsorption step of forming a reaction layer on a surface of an etching target wafer by supplying a reactive gas into a processing chamber; and a desorption step of exhausting the etchant gas, replacing the etchant gas with a rare gas, and then turning the rare gas into plasma to generate a rare gas in a metastable state, and irradiating the etching target wafer with the generated rare gas in a metastable state to remove the reaction layer. In addition, PTL 2 discloses a method including; an adsorption step of forming a reaction layer by using two different beam sources including a molecular beam source formed in plasma and a metastable excited species beam source of a rare gas and irradiating with a reactive gas or a radical from the molecular beam source; and a desorption step of removing the reaction layer by irradiating with the rare gas in the metastable state having high energy from the metastable excited species beam source.

CITATION LIST

Patent Literature

PTL 1: JP2017-228791A
PTL 2: JPH06-252108A

SUMMARY OF INVENTION

Technical Problem

In order to use such a cycle etching method for high-accuracy isotropic etching required for a three-dimensional device structure, it is required to selectively process only a target film by a self-limited process in the adsorption step and the desorption step. That is, the adsorption step requires a process in which the thickness of the reaction layer formed on an etching target material is saturated at a constant thickness, and the desorption step requires a process in which only the reaction layer formed on the etching target material volatilizes without progressing the etching of the etching target material under the reaction layer or the other materials desired to have a selectivity.

In addition, in order to be applied to mass production of a semiconductor, it is necessary to construct a cycle etching method excellent in mass productivity. That is, it is required that an etching amount of several nm to several tens of nm as a target can be achieved by a short-time process, and a stable etching amount can be obtained regardless of the number of cycles or the number of processed wafers by preventing generation of foreign matter in a chamber.

However, when the process of supplying the reactive gas described in PTLs 1 and 2 is used in the adsorption step, the thickness of the reaction layer formed on the surface is very thin, and it is difficult to obtain a sufficient etching amount per cycle.

Actually, etching a SiN film is attempted by repeating 50 cycles of the cycle etching of the adsorption step in which $CHF_3/O_2$ gas is used in the reactive gas and the desorption step in which Ar gas in a metastable state is supplied, but a change in the etching amount after 50 cycles is less than 0.1 nm (less than 0,002 nm/cycle) below a measurement limit, and a sufficient etching amount suitable for mass production of a level of several nm/cycle cannot be confirmed.

As a method for increasing the thickness of the reaction layer, a method for supplying highly reactive radicals is exemplified, and in particular, a method for generating and supplying radicals by turning the reactive gas into plasma is widely known.

However, in the method of using two beam sources to form the reaction layer and supply the rare gas in the metastable state as described in PTL 2, when the radicals are supplied using a carbon-containing gas used for cycle etching the SiN film such as $CHF_3$ gas, that is, a gas that generates a deposit, to form the reaction layer, a problem occurs that the deposit gradually adheres to the inside of the molecular beam source, and the etching amount is changed with an increase in the number of cycles and an increase in the number of processed wafers. In addition, a condition for establishing a self-limited process for realizing high-accuracy etching required for manufacturing a three-dimensional device is not clarified.

The invention solves the technical problems in the related art described above, and provides a method capable of constructing a self-limited process excellent in mass productivity in a cycle etching method in which an adsorption step of forming a reaction layer on a surface of an etching target wafer and a desorption step of removing the formed reaction layer using a rare gas in a metastable state are repeated.

Solution to Problem

In order to solve the above problem, the invention provides a plasma processing method including: an adsorption step of forming a reaction layer on an etching target film by plasma generated using a reactive gas; and a desorption step of removing the reaction layer by using a rare gas in a metastable state generated by plasma. The adsorption step and the desorption step are repeated, and a pressure in the adsorption step is higher than a pressure in the desorption step.

In addition, in order to solve the above problem, the invention provides a plasma processing method including: an adsorption step of forming a reaction layer on an etching target film by plasma generated using a reactive gas; and a desorption step of removing the reaction layer by using a rare gas in a metastable state generated by plasma. The adsorption step and the desorption step are repeated, and radio frequency power for generating the plasma in the adsorption step is smaller than radio frequency power for generating the plasma in the desorption step.

Further, in order to solve the above problem, the invention provides a plasma processing method in which an adsorption step and a desorption step are performed using plasma generated in a first space above the same separation plate, and a reactive gas and a rare gas are replaced while the generation of the plasma is maintained in the adsorption step and the desorption step.

Advantageous Effects of Invention

According to the invention, an etching target wafer can be irradiated with radicals having a high reactive property, and the thickness of the reaction layer can be increased to a level of several nm/cycle, which is suitable for mass production, by promoting surface reaction by the radicals.

In addition, when the reactive gas is excessively dissociated in the plasma, the etching proceeds continuously by the excessively dissociated reactive gas, and the self-limited process cannot be implemented, but by setting the pressure in the adsorption step to be higher than that in the desorption step, or by setting effective radio frequency power for generating the plasma in the adsorption step to be lower than effective radio frequency power for generating the plasma in the desorption step, it is possible to form a reaction layer in which the excessive dissociation of the reactive gas is prevented, and a self-limited cycle etching process can be implemented.

Further, by performing the adsorption step and the desorption step using the plasma generated in the same first space, it is possible to remove, in the desorption step, a deposit adhering to an inner wall of the first space in the adsorption step, and it is possible to implement a stable process with high mass productivity in which the adhesion of the deposit per cycle is prevented. In addition, by replacing the reactive gas and the rare gas while maintaining the generation of the plasma between the adsorption step and the desorption step, it is possible to omit, after the adsorption step, a step of first exhausting the reactive gas filled in a vacuum container, then introducing the rare gas for replacement, and then generating plasma, and it is possible to implement a short-time process excellent in mass productivity with a reduced process time per cycle.

BRIEF DESCRIPTION OF DRAWINGS

FIG. 4 is a cross-sectional view showing a typical magnetic field distribution in the plasma processing device according to the embodiment of the invention.

FIG. 5 is a graph showing a change in an etching amount of a SiN film per cycle with respect to a process time of a desorption step of a plasma processing method according to an embodiment of the invention when a pressure in a vacuum container in the desorption step was set higher than a pressure in the vacuum container in an adsorption step.

FIG. 6 is a graph showing a change in the etching amount of the SiN film per cycle with respect to the process time of the desorption step of the plasma processing method according to the embodiment of the invention when the pressure in the vacuum container in the desorption step was set the same as the pressure in the vacuum container in the adsorption step.

FIG. 7 is a graph showing a change in a SiN etching amount per cycle according to a ratio between the pressure in the desorption step and the pressure in the adsorption step of the plasma processing method according to the embodiment of the invention.

FIG. 8 is a graph obtained by comparing a deposited film thickness of an inner wall of a first space after performing only the adsorption step in the plasma processing method with a deposited film thickness of the inner wall of the first space after performing the adsorption step and the desorption step according to the embodiment of the invention.

FIG. 9 is a table obtained by comparing the SiN etching amount per cycle of, between the adsorption step and the desorption step, a case where generation of plasma was interrupted and a case where the generation of the plasma was maintained.

DESCRIPTION OF EMBODIMENTS

Figure 1:
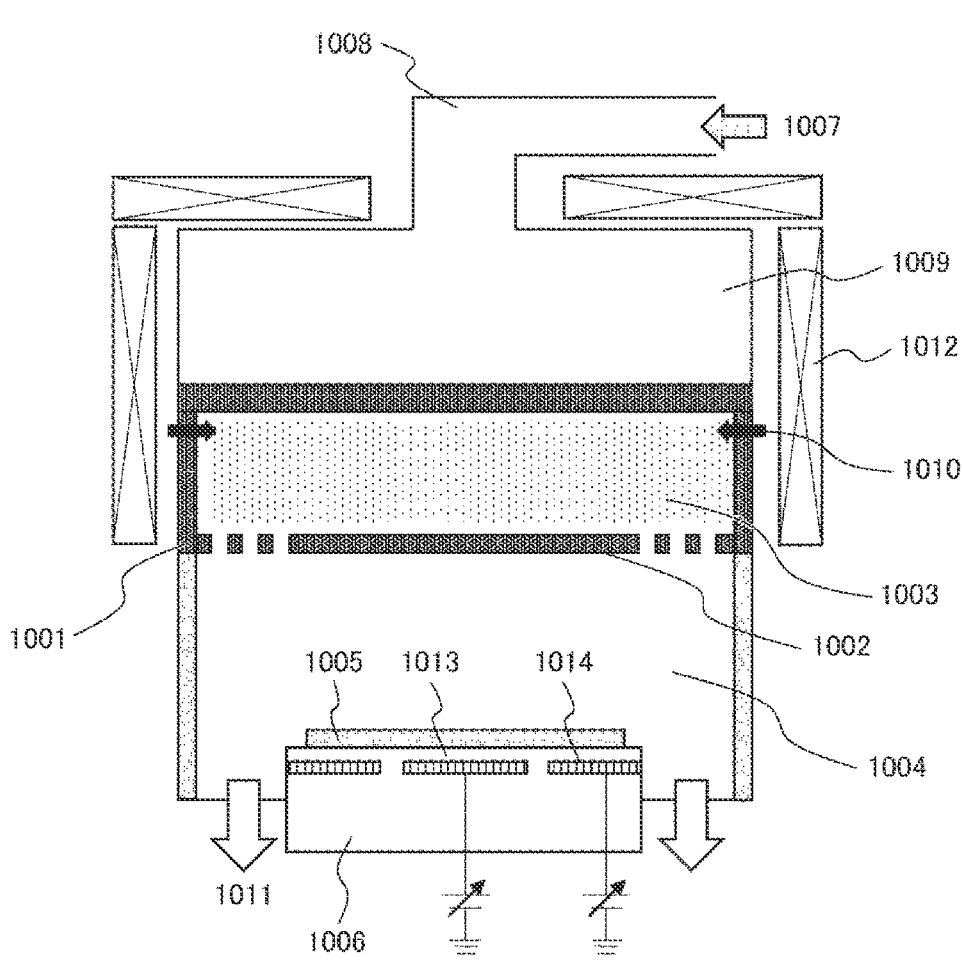
FIG. 1 is a cross-sectional view showing a schematic configuration of a plasma processing device according to an embodiment of the invention.

The invention relates to a plasma processing method to be performed in a dry etching device provided with a vacuum container having a depressurized inner side into which a processing gas is supplied, a separation plate dividing the vacuum container into a first space in an upper portion and a second space in a lower portion, and a wafer stage that is disposed in the second space and has an upper surface on which a processing wafer is placed. The plasma processing method includes: sequentially performing an adsorption step of forming a reaction layer on an etching target wafer by causing a reactive gas to be plasma in the first space in the upper portion and a desorption step of removing the reaction layer by causing a rare gas to be plasma in the first space in the upper portion; and performing etching in which a pressure in the vacuum container in the adsorption step is higher than a pressure in the vacuum container in the desorption step.

In addition, the invention relates to a plasma processing method to be performed in a dry etching device provided with a vacuum container having a depressurized inner side into which a processing gas is supplied, a separation plate dividing the vacuum container into a first space in an upper portion and a second space in a lower portion, and a wafer stage that is disposed in the second space and has an upper surface on which a processing wafer is placed. The plasma processing method includes: sequentially performing an adsorption step of forming a reaction layer on an etching target wafer by turning a reactive gas into plasma in the first space in the upper portion and a desorption step of removing the reaction layer by turning a rare gas into plasma in the first space in the upper portion; and performing etching in which effective radio frequency power for generating the plasma in the adsorption step is lower than effective radio frequency power for generating the plasma in the desorption step.

Further, the invention relates to a plasma processing method to be performed in a dry etching device provided with a vacuum container having a depressurized inner side into which a processing gas is supplied, a separation plate dividing the vacuum container into a first space in an upper portion and a second space in a lower portion, and a wafer stage that is disposed in the second space and has an upper surface on which a processing wafer is placed. The plasma processing method includes: repeatedly and continuously performing an adsorption step of forming a reaction layer on an etching target wafer by turning a reactive gas into plasma in the first space in the upper portion and a desorption step of removing the reaction layer by turning a rare gas into plasma in the first space in the upper portion; and performing etching in which the reactive gas and the rare gas are replaced while the generation of the plasma is maintained between the desorption step and the adsorption step or between the adsorption step and the desorption step.

In the above plasma processing method, a depositional reactive gas containing carbon or boron is used as the reactive gas, and Ar gas is used as the rare gas.

Hereinafter, embodiments according to the invention will be described with reference to the drawings.

Embodiment 1

A first embodiment according to the invention will be described with reference to FIGS. 1, 2, and 3.

Figure 2:
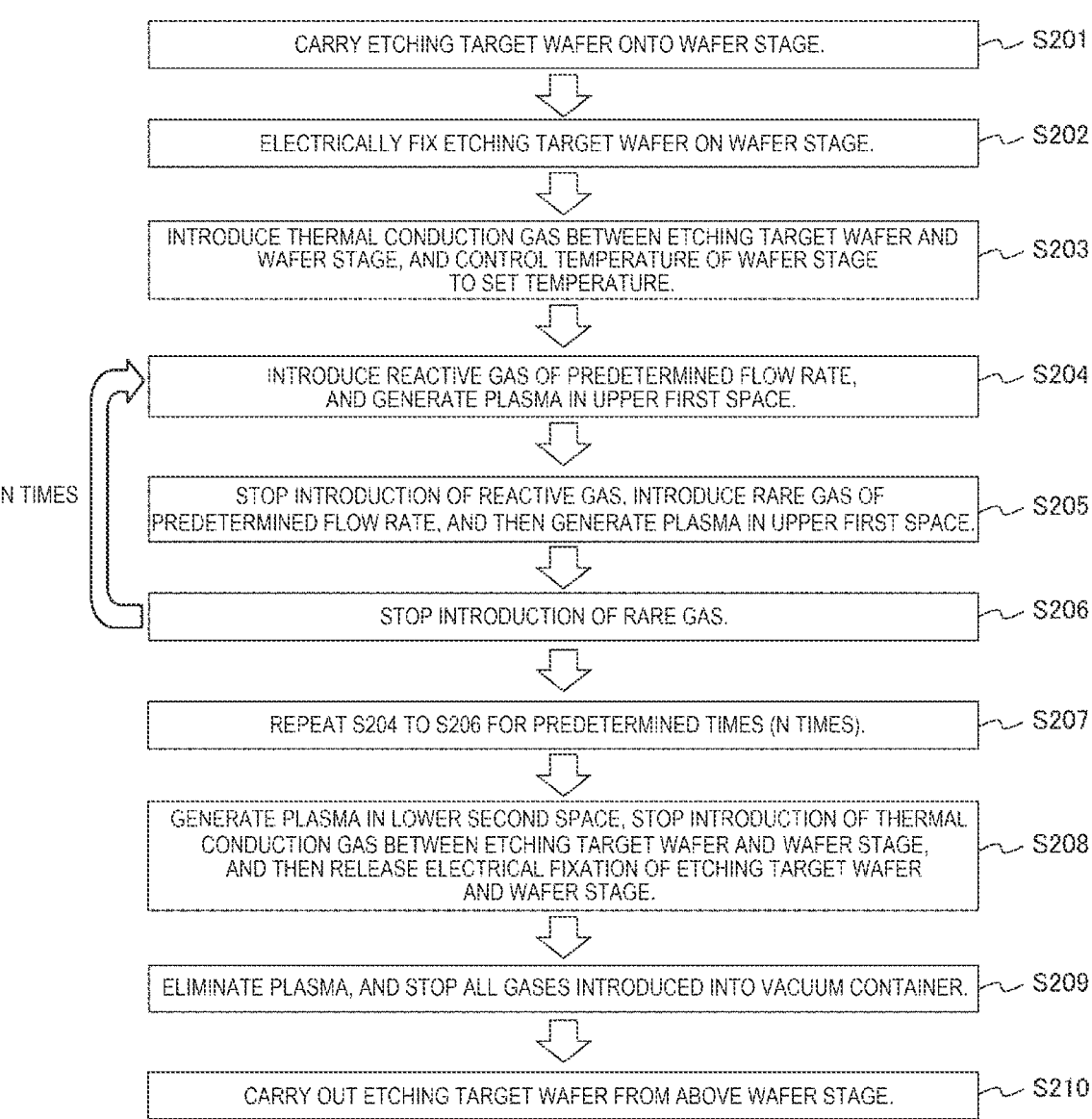
FIG. 2 is a flowchart showing a processing flow of a plasma processing method according to the embodiment of the invention.
Figure 3:
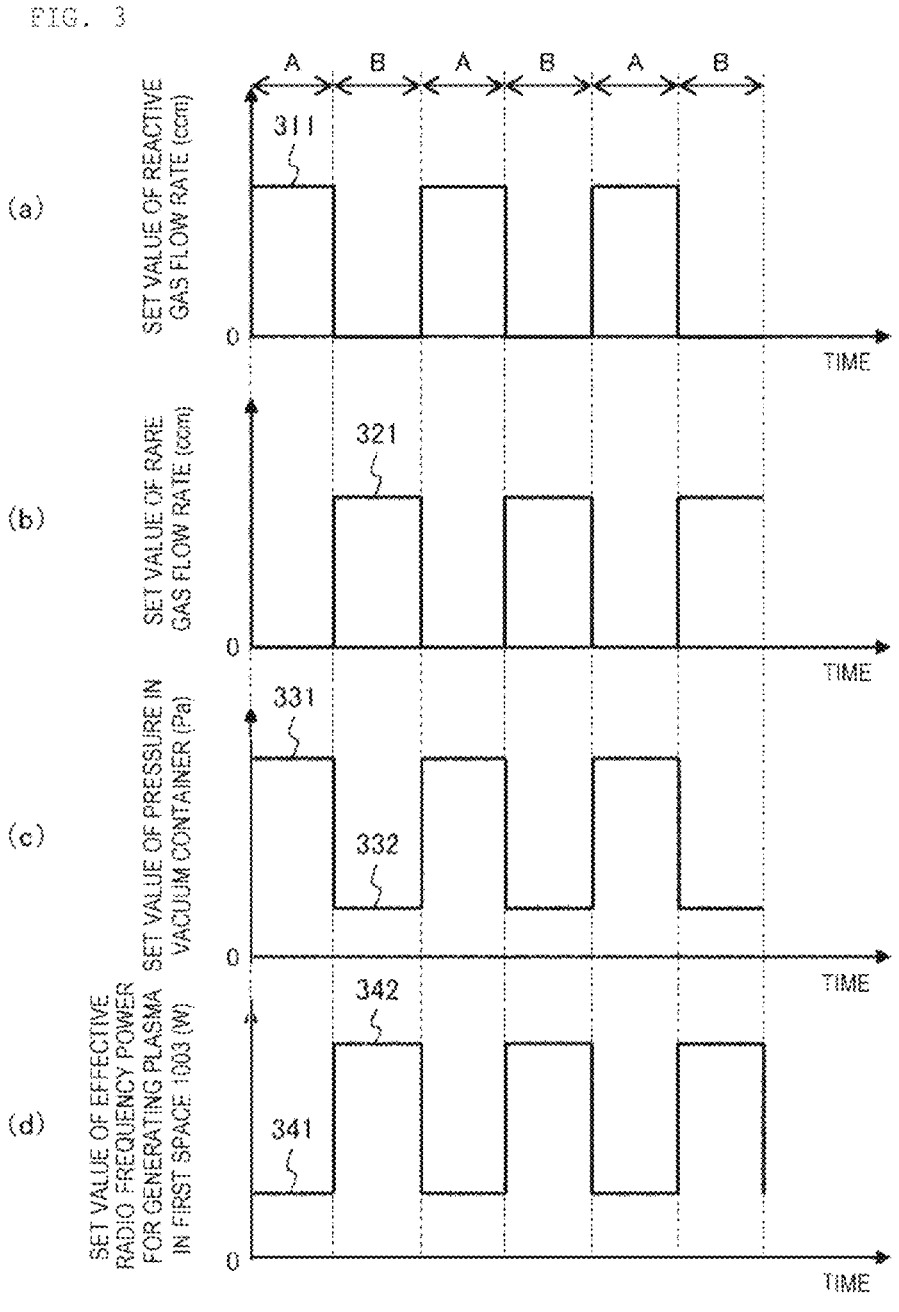
FIG. 3 is a time sequence diagram of step S208 in the flowchart shown in FIG. 2 in the plasma processing method according to the embodiment of the invention.

FIG. 1 shows a typical device structure for implementing the present embodiment using an electron cyclotron resonance plasma source, FIG. 2 is a flowchart for performing cycle etching using the present embodiment, and FIG. 3 is a time sequence diagram of step 208 shown in FIG. 2. Although the present embodiment describes the electron cyclotron resonance plasma source, the present method can be applied without being limited to the electron cyclotron resonance plasma source.

As shown in FIG. 1, a separation plate 1002 is provided inside a vacuum container 1001, and the inside of the vacuum container is separated into a first space 1003 in an upper portion and a second space 1004 in a lower portion by the separation plate 1002. The second space 1004 is provided with a wafer stage 1006 for placing an etching target wafer 1005, and the etching target wafer 1005 can be processed by irradiating with plasma or radicals generated in the plasma.

In order to generate the plasma, radio frequency power 1007 is introduced into the vacuum container 1001 from a portion above a device via a waveguide 1008 and a cavity resonance portion 1009. Here, a microwave having a frequency of 300 MHz to 300 GHz is used as the radio frequency power 1007 for generating the plasma.

In addition, a process gas 1010 is introduced into the vacuum container by a predetermined method, and is exhausted from 1011 at a lower portion of the vacuum container. At this time, a flow rate and an exhaust speed of the process gas 1010 are appropriately monitored, and the inside of the vacuum container can be maintained at any pressure by controlling the flow rate and the exhaust speed of the process gas in accordance with monitored values.

In the process gas introduced into the vacuum container, generation of plasma is maintained at a position where the radio frequency power 1007 and a static magnetic field generated by a static magnetic field coil 1012 cause electron cyclotron resonance. In a configuration of the device, it is possible to change a generation position of the plasma causing the electron cyclotron resonance based on a coil current value of the static magnetic field coil 1012, and when the generation position is set in the first space 1003, neutral radicals formed in the plasma are preferentially supplied to the etching target wafer.

On the other hand, when the generation position is set in the second space 1004, the etching target wafer is directly irradiated with the plasma, and processing using ions and radicals in the plasma is possible. That is, a plasma generation chamber can be separated into an upper plasma generation chamber formed by the first space 1003 and a lower plasma generation chamber formed by the second space 1004 by the separation plate 1002.

The wafer stage 1006 has a temperature control function and can be controlled to any temperature. In addition, the wafer stage 1006 has a function of fixing the etching target wafer on the wafer stage and a function of supplying a thermal conduction gas between the etching target wafer 1005 and the wafer stage 1006 to maintain a space therebetween at a pressure of, for example, 0.1 kPa to 10 kPa, A thermal conductivity of the wafer stage and the etching target wafer can be improved by the thermal conduction gas, and the temperature of the etching target wafer can be efficiently controlled even in the vacuum container.

The function of fixing the etching target wafer on the wafer stage may be implemented with a mechanical chuck for mechanically restraining and fixing an edge portion of the etching target wafer, but foreign matter generated by the wear of a restraining mechanism and the wafer when the wafer is fixed cause problems in mass production. Therefore, as shown in FIG. 1, it is desirable that the etching target wafer is electrically fixed on the wafer stage by generating Johnson Rahbek force or Coulomb force by providing a first electrode 1013 and a second electrode 1014 to which direct current voltages are to be applied in the wafer stage 1006 and applying opposite, that is, positive and negative voltages to the first electrode 1013 and the second electrode 1014 respectively.

Although not shown in FIG. 1, the wafer stage may be connected with a radio frequency power supply having a frequency of, for example, 10 KHz to 100 MHz to positively draw ions formed in the plasma into the etching target wafer. In this way, when the plasma is generated in the second space 1004, the radio frequency power supply can supply radio frequency power to the wafer stage, and reactive ion etching using ions and radicals in the plasma can be implemented.

In FIG. 1, the separation plate 1002 is provided to supply only the radicals to the etching target wafer. By using a metal material such as aluminum, titanium, or SUS for the separation plate and electrically connecting the separation plate to the ground, a direct current power supply, or an alternate current power supply to form a structure of the separation plate, a method may be used in which positive charge ions and negative charge electrons generated in the plasma are electrically shielded and only radicals generated in the plasma are supplied to the wafer. However, in this case, a problem during mass production occurs that the metal material is scattered due to exposure of a surface of the metal material to the plasma and electrical properties of the processed wafer deteriorate due to metal contamination.

As a method for preventing the metal contamination, considered is a method of using a structure in which the periphery of a conductive material is coated with a Si-containing oxide film, a Y-containing oxide film, or an Al-containing oxide film and a metal does not directly contact the plasma. However, there is a possibility that a production cost is increased by the coating and metal contamination occurs when a part of the coating film is removed due to long-time treatment.

Therefore, it is desirable that the structure of the separation plate 1002 is made of only a dielectric material including a Si-containing oxide film, a Y-containing oxide film, or an Al-containing oxide film. In particular, quartz which is a Si-containing oxide film does not contain a metal such as Y or Al therein, and is a desirable dielectric material for preventing metal contamination.

In this case, although the separation plate has no effect of electrically shielding ions or electrons formed in the plasma, radicals can be preferentially supplied to the etching target wafer 1005 by providing holes in an outer peripheral portion of the separation plate 1002 and generating a divergent magnetic field 4001 by the static magnetic field coil 1012 as shown in FIG. 4. That is, the ions which have positive charges and the electrons which have negative charges passing through the holes in the outer peripheral portion are constrained by the divergent magnetic field to diffuse in a direction of chamber walls 4002. Therefore, only electrically neutral radicals, which are not constrained by the divergent magnetic field, can reach the etching target wafer 1005 provided in a central portion of the chamber.

Only one separation plate is used in FIG. 1, and a plurality of separation plates may be combined. However it is desirable that one of the plurality of separation plates is provided with holes on the outer peripheral portion of the separation plate, that is, on an outer side of half the radius of the separation plate. In addition, as long as a gap is formed between the outer side of the separation plate and the chamber walls, a structure and an area of the holes are not particularly limited.

Next, a flowchart shown in FIG. 2 using the device shown in FIG. 1 describes a detailed embodiment of a cycle etching method including a step of forming a reaction layer by radicals generated by the reactive gas and a step of removing the reaction layer by using a rare gas in a metastable state generated by using a rare gas.

Although the present embodiment describes a discharge method using the electron cyclotron resonance using 2.45 GHz radio frequency power for generating the plasma shown in FIG. 1, the plasma source is not particularly limited as long as the device has the separation plate provided in the vacuum container and can generate the plasma in the first space above the separation plate. That is, a plasma source using another inductive coupling or capacitive coupling radio frequency power may be used.

First, as shown in S201 shown in FIG. 2, the etching target wafer 1005 is carried onto the wafer stage 1006. When the wafer is to be carried in, for example, the etching target wafer 1005 placed on a transfer arm is carried onto the wafer stage 1006 from a transfer chamber held in a vacuum, and three or more pusher pins (not shown) provided in the wafer stage are raised to lift the etching target wafer from the transfer arm by the pusher pins.

Next, a method is exemplified in which the etching target wafer is provided on the wafer stage by retracting the transfer arm into the transfer chamber and lowering the pusher pins holding the etching target wafer into the wafer stage.

In the method, in order to prevent generation of foreign matter due to wear of a wafer back surface and the pusher pins, it is desirable to select an optimum operating speed and an optimum shape and a material of tip ends of the pusher pins.

Next, as shown in S202 shown in FIG. 2, by applying opposite, that is, positive and negative direct current voltages to the first electrode 1013 and the second electrode 1014 provided in the wafer stage respectively, Johnson Rahbek force or Coulomb force is generated, and the etching target wafer 1005 is electrically fixed on the wafer stage 1006. Although it is desirable to apply the same voltage as the positive and negative voltages, either a positive voltage or a negative voltage may be applied to the first electrode 1013.

Accordingly, the etching target wafer is fixed on the wafer stage until the electrical fixation is released, and the etching target wafer moves due to change in pressure or the like during the process, so that it is possible to prevent the generation of foreign matter due to the wear of the etching target wafer and the wafer stage.

Next, as shown in S203 shown in FIG. 2, the thermal conduction gas is introduced between the etching wafer and the wafer stage. The thermal conductivity of the wafer stage and the etching target wafer is improved by the thermal conduction gas, and even in the vacuum container, the temperature of the etching target wafer can be efficiently controlled at a set temperature by using the temperature control function of the wafer stage.

It is desirable to use He which has good thermal conductivity and stability as the thermal conduction gas, and other gases such as Ar and $N_2$ may be used instead. In addition, it is desirable to maintain a space between the etching target wafer and the wafer stage at a pressure of 0.1 kPa to 10 kPa. In order for the etching target wafer to not move even under such pressure, it is desirable that the etching target wafer is electrically firmly fixed on the wafer stage by the direct current voltages applied to the first electrode 1013 and the second electrode 1014.

Next, as shown in S204 shown in FIG. 2, the reactive gas of a predetermined flow rate is introduced, the radio frequency power 1007 is supplied through the waveguide 1008, and the coil current value of the static magnetic field coil 1012 is set to cause electron cyclotron resonance in the upper first space 1003. Accordingly, the plasma is generated in the upper first space 1003. In this step, it is desirable to control the exhaust speed of the gas from the vacuum container 1011 so that the inside of the vacuum container 1001 is maintained at a set pressure.

In addition, by generating the divergent magnetic field by the static magnetic field coil 1012, the radicals formed in the plasma using the reactive gas preferentially reach the etching target wafer, Therefore, an adsorption step of forming the reaction layer having a desired film thickness on the etching target wafer by the radicals can be implemented.

When only the reactive gas is introduced without generating the plasma, the thickness of the formed reaction layer is very thin, and it is difficult to obtain a sufficient etching amount per cycle.

In addition, when the plasma is generated in the lower second space 1004 and the etching target wafer is directly irradiated with the plasma, a self-bias is generated between the plasma and the etching target wafer, Therefore, the ions generated in the plasma are accelerated by the self-bias and are vertically incident on the etching target wafer.

Accordingly, the reaction layer is formed thick in a vertical direction, and isotropic etching of uniformly etching in the vertical direction and a lateral direction cannot be implemented. Therefore, it is desirable to form the reaction layer by a process in which the radicals generated by the reactive gas are mainly used. Specifically, it is desirable to construct a process in which the reaction layer is formed by irradiating the etching target wafer with radicals ten times or more as much as an irradiation amount of the ions irradiating the etching target wafer.

When the radicals are formed using the reactive gas, if excessive dissociation proceeds in the plasma, etching an etching target material continuously proceeds by the excessively dissociated reactive gas, and a self-limited process is not established.

In order to prevent the excessive dissociation, it is desirable to set a pressure in the vacuum container in the adsorption step to be higher than a pressure in the vacuum container in a desorption step. Specifically, it is desirable to select any pressure from a range of 1.0 Pa to 500 Pa as the pressure in the vacuum container in the adsorption step and from a range of 0.05 Pa to 50 Pa as the pressure in the vacuum container in the desorption step, so that the pressure in the vacuum container in the adsorption step is higher than the pressure in the vacuum container in the desorption step.

Specifically, it is desirable to select any pressure from a range of 5.0 Pa to 50 Pa as the pressure in the vacuum container in the adsorption step and from a range of 0.1 Pa to 10 Pa as the pressure in the vacuum container in the desorption step, so that the pressure in the vacuum container in the adsorption step is higher than the pressure in the vacuum container in the desorption step.

In addition, in order to prevent the excessive dissociation of the plasma by using the reactive gas, it is also effective to set effective radio frequency power for generating the plasma in the adsorption step to be lower than effective radio frequency power for generating the plasma in the desorption step.

Here, the effective radio frequency power means a total amount of power to be supplied per unit time. Therefore, for example, when using pulse discharge in which on and off of the radio frequency power are repeated in a cycle from 0,0001 s to 0.01 s, the effective radio frequency power is calculated by a product of the radio frequency power and a duty ratio which is a proportion of an on time of the radio frequency power per cycle.

That is, when radio frequency power of 1000 W is supplied and the duty ratio is set to 20%, the effective radio frequency power is 200 W. Therefore, when the same radio frequency power is set in the adsorption step and the desorption step, by setting the duty ratio in the adsorption step to be lower than that in the desorption step, it is possible to implement a process in which the effective radio frequency power in the adsorption step is set to be lower than the effective radio frequency power in the desorption step.

Next, as shown in S205 Shown in FIG. 2, the introduction of the reactive gas into the vacuum container is stopped, the rare gas of the predetermined flow rate is introduced, and then the radio frequency power is supplied from 1007, and the coil current value of the static magnetic field coil 1012 is set to cause the electron cyclotron resonance in the upper first space 1003. Accordingly, the plasma is generated in the upper first space 1003.

In this step, it is desirable to control the exhaust speed of the gas from the vacuum container 1011 so that the inside of the vacuum container 1001 is maintained at a set pressure.

In addition, by generating the divergent magnetic field by the static magnetic field coil 1012, the radicals formed in the plasma using the rare gas, in particular, the rare gas in the metastable state having a long life, preferentially reach the etching target wafer.

The rare gas in the metastable state has high reactivity, and when the rare gas collides with the reaction layer generated in step S204, the reaction layer can be easily desorbed. It is desirable to use He, Ne, Ar, or Xe gas as the rare gas for generating the metastable state. In particular, Ar gas is suitable for mass production at low cost among the rare gases, and has a long life in the metastable state, Therefore, it is desirable to generate the plasma using Ar gas.

When the plasma is generated in the lower second space 1004 and the etching target wafer is directly irradiated with the plasma, the self-bias is generated between the plasma and the etching target wafer, and Ar ions generated in the plasma are accelerated by the self-bias and are vertically incident on the etching target wafer.

Therefore, a film having a desired selectivity (not desired to be etched) is also processed in the same manner, and the selectivity deteriorates. Therefore, it is desirable to desorb the reaction layer by a process in which the rare gas in the metastable state is mainly used. Specifically, it is desirable that the reaction layer is desorbed by irradiating the etching target wafer with the rare gas in the metastable state ten times or more as much as the irradiation amount of the ions irradiating the etching target wafer.

The introduction of the reactive gas is stopped between step S204 and step S205 and the rare gas of the predetermined flow rate is introduced, but if a target etching amount can be achieved in the adsorption step of forming the reaction layer and the desorption step of S205 of removing the reaction layer, it is desirable to perform the step S205 by changing a gas type and the radio frequency power to be introduced into the vacuum container while generating and maintaining the plasma after the step S204 is completed.

Accordingly, it is possible to omit, after the adsorption step, a step of first exhausting the reactive gas filled in the vacuum container, then introducing the rare gas for replacement, and then generating plasma, and it is possible to implement a short-time process excellent in mass productivity with a reduced process time per cycle.

In addition, a deposit may be formed on an inner wall of the first space 1003 by the plasma formed by the reactive gas in the adsorption step of S204, but the deposit can be removed by performing the desorption step of S205 of generating the plasma using the rare gas in the same first space 1003 as that in the adsorption step S204. This is because, in the first space 1003, the ions formed in the plasma collide with the inner wall of the first space 1003 by the self-bias, and the deposit can be removed by a sputtering reaction.

In a process in which the deposit accumulates in the first space 1003, an amount of the deposit increases and a state of the plasma changes due to an increase in the number of cycles or an increase in the number of processed wafers. Therefore, the process variation is large, and a stable process suitable for mass production cannot be implemented.

However, by performing the adsorption step of S204 and the desorption step of S205 using the plasma generated in the same first space 1003, it is possible to remove, in the desorption step, the deposit adhering to the inner wall of the first space 1003 in the adsorption step, and it is possible to implement a stable process with high mass productivity in which the adhesion of the deposit per cycle is prevented.

In this step, the rare gas in the metastable state may reach the wafer, and for example, a mixed gas of rare gases obtained by mixing two or more kinds of rare gases such as mixing He and Ar may be turned into plasma to generate the rare gas in the metastable state.

In addition, in order to prevent etching of other materials having a desired selectivity, a mixed gas obtained by mixing a reactive gas, for example, oxygen or nitrogen mixed gas such as $O_2$, $CO_2$, or $N_2$, with the rare gas may be turned into plasma to generate another mixed gas obtained by mixing the radicals generated from the reactive gas with the rare gas in the metastable state, and the other mixed gas may be used in the desorption step of S205. However, in order to actively use the rare gas in the metastable state, the content of the rare gas in the other mixed gas is preferably 50% or more.

Next, as shown in S206 shown in FIG. 2, the introduction of the rare gas into the vacuum container is stopped.

Next, as shown in S207 shown in FIG. 2, step S204 of forming the reaction layer by the radicals generated by the reactive gas and the step S205 of removing the reaction layer by the rare gas in the metastable state generated by using the rare gas are repeated N times, which is a predetermined number of times. When target etching is performed on the etching target wafer in step S205 for the first time, cycle etching is not performed, and N may be set to one.

When these steps are to be repeated N times, the introduction of the rare gas is stopped in step S206, and the process returns to step S204 to introduce the reactive gas of the predetermined flow rate, but if a predetermined process can be implemented in the desorption step of S205 and the adsorption step of S204, it is desirable to execute the step S204 by changing the gas type and the radio frequency power to be introduced into the vacuum container while generating and maintaining the plasma after the step S205 is completed.

Accordingly, it is possible to omit, after the desorption step of S205, a step of first exhausting the rare gas filled in the vacuum container, then introducing the reactive gas for replacement, and then generating the plasma for executing the step S204, and it is possible to implement a short-time process excellent in mass productivity with a reduced process time per cycle.

A time sequence diagram shown in FIG. 3 shows representative example of changes in (a) a set value of a reactive gas flow rate, (b) a set value of a rare gas flow rate, (c) a set value of a pressure in a vacuum container, and (d) a set value of effective radio frequency power for generating plasma when these steps are to be repeated N=3 times in the step S207 shown in FIG. 2.

The time sequence shows a sequence in which an adsorption step A (S204) of forming a reaction layer by radicals generated by a reactive gas 311 and a desorption step B (S205) of removing the reaction layer by using a rare gas in a metastable state generated by using a rare gas 321 are repeated three times.

As described above, in order to prevent excessive dissociation in the adsorption step A (S204) and construct a self-limited process, it is desirable to set a pressure 331 in the vacuum container in the adsorption step A (S204) to be higher than a pressure 332 in the vacuum container in the desorption step B (S205). Further, in order to prevent the excessive dissociation in the adsorption step A and construct the self-limited process, it is desirable to set a set value 341 of effective radio frequency power for generating plasma in the adsorption step A to be lower than a set value 342 of effective radio frequency power for generating plasma in the desorption step B.

In FIG. 3, the pressure 331 in the vacuum container in the adsorption step A (corresponding to S204) is set to be higher than the pressure 332 in the vacuum container in the desorption step B (corresponding to S205), and the set value 341 of the effective radio frequency power for generating the plasma in the adsorption step A is set to be lower than the set value 342 of the effective radio frequency power for generating the plasma in the desorption step B, and as long as the self-limited process can be constructed, only one of the settings may be satisfied.

Further, by performing the adsorption step and the desorption step using the plasma generated in the same first space, it is possible to remove, in the desorption step, a deposit adhering to an inner wall of the first space in the adsorption step, and it is possible to implement a stable process with high mass productivity in which the adhesion of the deposit per cycle is prevented.

In addition, by setting the effective radio frequency power for maintaining the generation of the plasma between the adsorption step and the desorption step to a value larger than 0, it is possible to replace the reactive gas and the rare gas with each other while maintaining the generation of the plasma, and it is possible to implement a short-time process excellent in mass productivity with a reduced process time per cycle.

Next, as shown in S208 shown in FIG. 2, plasma is generated in the lower second space 1004, the introduction of the thermal conduction gas between the etching target wafer and the wafer stage is stopped, and then the electrical fixation of the etching target wafer 1005 and the wafer stage 1006 is released. Here, if the first electrode 1013 and the second electrode 1014 have the same area and the applied voltages are turned off at the same timing, the electrical fixation can be released in principle without the plasma.

However, due to a slight difference in area between the two electrodes caused by a mechanical difference or a slight deviation in timing of turning off the applied voltages, charges may be accumulated in the etching target wafer and the wafer stage. In this case, a problem in mass production is that the electrical fixation is not completely released and the wafer is occasionally damaged when the wafer is carried out.

Therefore, it is desirable to release the charges accumulated in the etching target wafer or the wafer stage by generating the plasma in the second space 1004 immediately above the etching target wafer and forming an electrical path by electrons and ions in the plasma. That is, it is desirable to turn off the direct current voltages applied to the first electrode 1013 and the second electrode 1014 in a state where the plasma is generated in the second space 1004. With such a configuration, it is possible to prevent damage to the wafer when the wafer is carried out and implement a process suitable for mass production.

When the direct current voltages applied to the first electrode 1013 and the second electrode 1014 are turned off, a voltage value applied to the first electrode 1013 and the second electrode 1014 may be changed or the pusher pins may be moved up and down while the plasma is generated in the second space to more easily remove the accumulated charges.

In this step, it is desirable to select a gas that does not greatly affect the shape of the etching target wafer, for example, a rare gas, as the gas used when generating the plasma. In addition, by skipping step S206 in a state where step S205 immediately before is completed, the plasma may be generated in the second space by the rare gas used in step S205 immediately before. In this way, it is possible to omit the step of first exhausting the rare gas filled in the vacuum container and then introducing the rare gas, which can shorten a process time.

When an etching shape is largely changed by generating the plasma in the second space 1004, the direct current voltages applied to the first electrode 1013 and the second electrode 1014 may be turned off without generating the plasma in the second space. However, in this case, in order to prevent the damage to the wafer, it is required to particularly consider a lift speed of the pusher pins and select a material in which the charges are hardly accumulated in the pusher pins and the wafer stage.

Next, as shown in S209 shown in FIG. 2, the plasma is eliminated, and all the gases introduced into the vacuum container are stopped. Next, as shown in S210 shown in FIG. 2, the etching target wafer 1005 is carried out from a position on the wafer stage 1006.

When the wafer is to be carried out, for example, by raising three or more pusher pins (not shown) provided in the wafer stage 1006, the etching target wafer 1005 is lifted and insert the transfer arm from the transfer chamber. At this time, in order to prevent contact between the etching target wafer 1005 and the transfer arm, it is required to lift the etching target wafer 1005 to a position higher than that of the transfer arm which is inserted. Thereafter, the etching target wafer can be held by the transfer arm by lowering the pusher pins into the wafer stage. Thereafter, the etching target wafer can be carried out from the inside of the vacuum container 1001 by retracting the transfer arm into the transfer chamber.

In the method, in order to prevent generation of foreign matter due to wear of a wafer back surface and the pusher pins, it is desirable to select an optimum operating speed and an optimum shape and a material of tip ends of the pusher pins.

In the sequence shown in FIG. 2, the temperature of the wafer stage 1006 is not changed after step S202, and may be set to different temperatures in the adsorption step of S204 and the desorption step of S205 if necessary. However, since the process time is increased by changing the temperature of the wafer stage 1006, it is desirable not to change the temperature of the wafer stage 1006 after step S202. Specifically, it is desirable to set the temperature of the wafer stage 1006 to any temperature in a range of −50° C. to +150° C. and maintain the temperature in the adsorption step and the desorption step.

Here, in the sequence diagram shown in FIG. 2, the etching target wafer 1005 is described as being limited to an isotropic etching process, and it is also possible to perform anisotropic etching before and after performing isotropic etching on a target film formed on the etching target wafer 1005. In this case, it is desirable to generate the plasma in the second space 1004 below the separation plate 1002 and perform the anisotropic etching using the ions and the radicals generated in the plasma.

In addition, although not shown in the sequence diagram shown in FIG. 2, when different etching target wafers are successively processed, it is also possible to periodically perform a cleaning sequence using the plasma between an etching target wafer to be processed first and an etching target wafer to be processed next. In the cleaning sequence, it is desirable to use a sequence for removing a reaction product from the etching target material attached to an inner wall of the vacuum container during etching or a sequence for attaching a deposit to maintain the inner wall of the vacuum container in a constant state.

In the cleaning sequence, it is desirable to generate the plasma in the second space below the separation plate to which a reaction product from the etching target wafer is likely to adhere, but since the reaction product from the etching target wafer may adhere to the first space above the separation plate, it is desirable to perform a cleaning sequence in which the plasma is sequentially generated in the first space and the second space.

When the cleaning sequence is performed, a wafer for cleaning may be placed on the wafer stage, but since the cost of the wafer for cleaning is high, it is desirable to perform the cleaning sequence without placing the wafer for cleaning on the wafer stage.

Embodiment 2

Next, a second embodiment using the invention will be described.

The embodiment shows a result of examination on a cycle etching process in which $CHF_3/O_2$ gas is used as a reactive gas, Ar gas is used as a rare gas, SiN is used as an etching target material, and SiN is isotropically processed. The present embodiment describes a result of using a depositional carbon-containing gas as the reactive gas, and the same process can be implemented for other depositional gases, for example, a boron-containing gas or a Si-containing gas.

FIG. 5 is a graph showing a change 501 in the etching amount of the SiN film per cycle with respect to the process time of the desorption step of S205 when etching was repeated N=6 times of cycle for S204 to S206 according to the sequence shown in FIG. 2.

In the experiment, the pressure in the vacuum container in the adsorption step of S204 is set to be higher than the pressure in the vacuum container in the desorption step of S205, and the effective radio frequency power in the desorption step of S205 was set to be lower than that in the adsorption step of S204. Specifically, a pressure in the vacuum container 1001 was set to 8.0 Pa in the adsorption step of S204 and 0.2 Pa in the desorption step of S205.

In addition, effective radio frequency power was reduced to 40 W in the adsorption step of S204 and set to 600 W in the desorption step of S205. In the adsorption step of S204, pulse discharge was used to reduce the effective radio frequency power.

From the graph shown in FIG. 5, it can be seen that even when the process time of the desorption step of S205 was increased to 120 seconds or longer, the etching amount was not increased, and a self-limited process in which the etching amount is saturated at 2.7 nm/cycle was constructed. The etching amount per cycle can be adjusted to any value according to process conditions, that is, the temperature of the wafer stage, a pressure, and a gas flow rate ratio of $CHF_3$ and $O_2$.

FIG. 6 is a graph showing a change 601 in the etching amount of the SiN film per cycle with respect to the process time of the desorption step of S205 when only the pressure in the adsorption step of S204 was changed to 0.2 Pa which is the same as that in the desorption step of S205 in the same process as in FIG. 5.

From the graph shown in FIG. 6, it can be seen that the etching amount per cycle increased in proportion to a processing time, and the self-limited process was not constructed. In addition, even when a processing pressure was further reduced, the self-limited process was not constructed.

When the pressure in the vacuum container was set to be lower than that in the desorption step of S205, the reactive gas is excessively dissociated to generate F radicals. This is because the F radicals promote the etching of the SiN film of the etching target material and the etching proceeds continuously.

Similarly, a method of increasing the effective radio frequency power is exemplified as a method of promoting dissociation of the F radicals. When the effective radio frequency power in the adsorption step of S204 was increased to 600 W or higher which is the same as that in the desorption step of S205, the self-limited process was not constructed.

From the above, it can be seen that the self-limited process can be constructed when the pressure in the adsorption step of S204 is set to be higher than that in the desorption step of S205 and the effective radio frequency power in the adsorption step of S204 is set to be lower than that in the desorption step of S205.

FIG. 7 shows a change 701 in the SiN etching amount per cycle according to a ratio of the pressure in the desorption step of S205 and the pressure in the adsorption step of S204 by changing the pressure in the desorption step of S205.

From the drawing, it can be seen that as the ratio of the pressure in the desorption step of S205 and the pressure in the adsorption step of S204 was increased, the etching amount per cycle was decreased, and when the ratio of the pressures was 1, the etching amount per cycle showed a value of 1 nm/cycle or less necessary for mass production. From the above, it can be seen that the etching amount of 1 nm/cycle or more, that is, the cycle etching of the nm level necessary for mass production can be implemented when the pressure in the adsorption step of S204 is set to be higher than the pressure in the desorption step of S205.

Similarly, as a result of evaluating a change in the etching amount per cycle according to a ratio of the effective radio frequency power in the desorption step of S205 and the effective radio frequency power in the adsorption step of S204, it can be seen that as the ratio of the effective radio frequency power increases, the etching amount per cycle increases, and that when the ratio of the effective radio frequency power is 1, a value of 1 nm/cycle or less, that is, the cycle etching of the nm level necessary for mass production cannot be implemented.

From the above, it can be seen that etching with a higher throughput can be implemented when the effective radio frequency power in the adsorption step of S204 is set to be lower than the effective radio frequency power in the desorption step of S205.

From the above results, it can be seen that it is effective to set the pressure in the adsorption step to be higher than that in the desorption step or to set the effective radio frequency power in the adsorption step to be lower than that in the desorption step to implement the cycle etching of the nm level necessary for mass production as well as the construction of the self-limited process.

The etching amount of 1 nm/cycle or less may be required in a process in which an etching amount of a target film is small, but since the self-limited process can be constructed in this case, it is desirable to construct a process through which a target etching amount is satisfied by the temperature, the pressure, or the gas type from the process conditions under which one of conditions for setting the pressure in the adsorption step of S204 to be higher than that in the desorption step of S205 and setting the effective radio frequency power in the adsorption step of S204 to be lower than that in the desorption step of S205 is satisfied.

FIG. 8 shows a result of evaluating the film thickness of a deposit deposited on an inner wall of the first space 1003 after $CHF_3/O_2$ plasma was generated in the first space 1003 above the separation plate 1002 and the adsorption step is performed, and after $CHF_3/O_2$ plasma and Ar plasma were generated in the first space 1003 above the separation plate 1002 and the adsorption step of S204 and the desorption step of S205 were performed.

As shown in 801 shown in FIG. 8, when only the adsorption step of S204 is performed using the plasma generated in the first space 1003, the deposit adheres to the inner wall of the vacuum container 1001. As shown in 802 shown in FIG. 8, the deposit can be removed by performing the desorption step of S205 of generating the plasma using the rare gas in the same first space 1003 as the adsorption step of S204.

This is because, in the first space 1003, ions formed in the plasma collide with the inner wall of the first space 1003 by a self-bias, and the deposit can be removed by a sputtering reaction. In a process in which the deposit accumulates in the first space 1003, an amount of the deposit increases and a state of the plasma changes due to an increase in the number of cycles or an increase in the number of processed wafers. Therefore, the process variation is large, and a stable process suitable for mass production cannot be implemented.

However, by performing the adsorption step of S204 and the desorption step of S205 using the plasma generated in the same first space 1003, it is possible to remove, in the desorption step of S205, the deposit adhering to the inner wall of the first space in the adsorption step of S204, and it is possible to implement a stable process with high mass productivity in which the adhesion of the deposit per cycle is prevented.

The present embodiment describes the result of using the carbon-containing gas as the reactive gas used in the adsorption step of S204, and the same process can be implemented for other depositional gases, for example, a boron-containing gas or a Si-containing gas.

In addition, in the present embodiment, quartz, which is an oxide film, was used as the separation plate 1002 and the inner wall of the first space 1003. Accordingly, oxygen in the oxide film, which is an inner wall material of the first space 1003, reacts with a carbon-based deposited film to promote the sputtering reaction in the desorption step of S205, thereby improving the removal efficiency of the deposited film. Therefore, it is desirable that an oxide film is formed on a part of a surface of the first space in contact with the plasma. Specifically, it is desirable that 50% or more of a surface area of the first space 1003 is the oxide film.

FIG. 9 shows a result of comparing a SiN etching amount 903 per cycle in a case 901 where the generation of the plasma was interrupted between the adsorption step of S204 and the desorption step of S205 and a case 902 where the generation of the plasma was maintained between the adsorption step of S204 and the desorption step of S205.

In the case of 901 where the generation of the plasma was interrupted, after the adsorption step of S204, first, the reactive gas filled in the vacuum container was exhausted, then the rare gas was introduced for replacement, and then the plasma was generated. In addition, after the desorption step of S205, a step of first exhausting the rare gas filled in the vacuum container, then introducing the reactive gas for replacement, and then generating the plasma was repeated.

On the other hand, in the case of 902 where the generation of the plasma was maintained, the introduction of the reactive gas was stopped and the introduction of the rare gas was started while generation of the plasma was maintained. In addition, a step of stopping the introduction of the rare gas and starting the introduction of the reactive gas while maintaining the generation of the plasma was repeated.

It can be seen from FIG. 9 that the SiN etching amount 903 per cycle did not greatly change in either case. From the above, it can be seen that by replacing the reactive gas and the rare gas while maintaining the generation of the plasma between the adsorption step of S204 and the desorption step of S205, it is possible to omit, after the adsorption step of S204, a step of first exhausting the reactive gas filled in a vacuum container, then introducing the rare gas for replacement, and then generating plasma, and it is possible to implement a short-time process excellent in mass productivity with a reduced process time per cycle.

As described above, according to the present embodiment, by turning the reactive gas into plasma in the first space 1003 above the separation plate 1002, radicals having a high reactive property can irradiate the etching target wafer. The thickness of the reaction layer can be increased to a level of several nm/cycle suitable for mass production by promoting surface reaction by the radicals.

In addition, when the reactive gas is excessively dissociated in the plasma, the etching proceeds continuously by the excessively dissociated reactive gas, and the self-limited process cannot be implemented, but by setting the pressure in the adsorption step of S204 to be higher than that in the desorption step of S205, or by setting the effective radio frequency power for generating the plasma in the adsorption step of S204 to be lower than the effective radio frequency power for generating the plasma in the desorption step of S205, it is possible to form a reaction layer in which the excessive dissociation of the reactive gas is prevented, and a self-limited cycle etching process can be implemented.

Further, by performing the adsorption step of S204 and the desorption step of S205 using the plasma generated in the same first space 1003, it is possible to remove, in the desorption step, the deposit adhering to the inner wall of the first space in the adsorption step of S204, and it is possible to implement a stable process with high mass productivity in which the adhesion of the deposit per cycle is prevented.

In addition, by replacing the reactive gas and the rare gas while maintaining the generation of the plasma between the adsorption step of S204 and the desorption step of S205, it is possible to omit, after the adsorption step, a step of first exhausting the reactive gas filled in a vacuum container, then introducing the rare gas for replacement, and then generating plasma, and it is possible to implement a short-time process excellent in mass productivity with a reduced process time per cycle.

The invention is not limited to the above embodiments, and includes various modifications. For example, the embodiments described above have been described in detail for easy understanding of the invention, and the invention is not necessarily limited to those including all of the configurations described above. Further, a part of a configuration of an embodiment may be replaced with a configuration of another embodiment, and a configuration of an embodiment may also be added with a configuration of another embodiment. Further, a part of the configuration of each embodiment can be added to, deleted from, or replaced with another configuration.

REFERENCE SIGNS LIST

1001: vacuum container
1002: separation plate
1003: first space
1004: second space
1005: etching target wafer
1006: wafer stage
1007: radio frequency power
1008: waveguide
1009: cavity resonance portion
1010: process gas 1011: exhaust direction
1012: static magnetic field coil
1013: first electrode
1014: second electrode
4001: divergent magnetic field

The invention claimed is:

1. A plasma processing method, comprising:
an adsorption step of forming a reaction layer on an etching target film by plasma generated using a reactive gas; and
a desorption step of removing the reaction layer by using a rare gas in a metastable state generated by plasma, wherein
the adsorption step and the desorption step are repeated,
a pressure in the adsorption step is higher than a pressure in the desorption step, and
the method proceeds from the adsorption step to the desorption step in a state where the plasma is maintained, or proceeds from the desorption step to the adsorption step in a state where the plasma is maintained.

2. The plasma processing method according to claim 1, wherein
the pressure in the adsorption step is a pressure within a range of 1.0 Pa to 500 Pa, and
the pressure in the desorption step is a pressure within a range of 0.05 Pa to 50 Pa.

3. The plasma processing method according to claim 1, wherein
a carbon element-containing gas, a boron element-containing gas, or a silicon element-containing gas is used as the reactive gas.

4. The plasma processing method according to claim 1, wherein
Ar gas is used as the rare gas.

5. The plasma processing method according to claim 1, wherein
$CHF_3$ gas and $O_2$ gas are used as the reactive gas.

6. The plasma processing method according to claim 1, wherein
radio frequency power for generating the plasma in the adsorption step is smaller than radio frequency power for generating the plasma in the desorption step.

7. The plasma processing method according to claim 6, wherein
the radio frequency power for generating the plasma in the adsorption step is pulse-modulated.

8. The plasma processing method according to claim 1, wherein
a plasma processing device by which the adsorption step and the desorption step are performed includes
a processing chamber configured to allow a sample having the etching target film to be processed and having a dielectric plate disposed above;
a radio frequency power supply configured to supply, via the dielectric plate, radio frequency power of microwaves for generating the plasma;
a sample stage configured to allow the sample to be placed; and
a separation plate disposed between the dielectric plate and the sample stage, wherein
the adsorption step and the desorption step are performed using plasma generated between the dielectric plate and the separation plate.

9. The plasma processing method according to claim 8, further comprising:

cleaning the processing chamber using plasma generated between the separation plate and the sample stage.

10. The plasma processing method according to claim 9, wherein the sample is not placed on the sample stage during the cleaning.

11. A plasma processing method, comprising:

an adsorption step of forming a reaction layer on an etching target film by plasma generated using a reactive gas; and a desorption step of removing the reaction layer by using a rare gas in a metastable state generated by plasma, wherein the adsorption step and the desorption step are repeated, radio frequency power for generating the plasma in the adsorption step is smaller than radio frequency power for generating the plasma in the desorption step, and the method proceeds from the adsorption step to the desorption step in a state where the plasma is maintained, or proceeds from the desorption step to the adsorption step in a state where the plasma is maintained.

12. The plasma processing method according to claim 11, wherein the radio frequency power for generating the plasma in the adsorption step is pulse-modulated.

13. The plasma processing method according to claim 11, wherein a carbon element-containing gas, a boron element-containing gas, or a silicon element-containing gas is used as the reactive gas.

14. The plasma processing method according to claim 11, wherein

Ar gas is used as the rare gas.

15. The plasma processing method according to claim 11, wherein $CHF_3$ gas and $O_2$ gas are used as the reactive gas.

16. The plasma processing method according to claim 11, wherein a temperature of a sample stage on which a sample having the etching target film is placed in the adsorption step is the same as a temperature of the sample stage in the desorption step.

17. The plasma processing method according to claim 11, wherein a plasma processing device by which the adsorption step and the desorption step are performed includes a processing chamber configured to allow a sample having the etching target film to be processed and having a dielectric plate disposed above;

a radio frequency power supply configured to supply, via the dielectric plate, radio frequency power of microwaves for generating the plasma;

a sample stage configured to allow the sample to be placed; and a separation plate disposed between the dielectric plate and the sample stage, wherein the adsorption step and the desorption step are performed using plasma generated between the dielectric plate and the separation plate.

18. The plasma processing method according to claim 17, further comprising:

cleaning the processing chamber using plasma generated between the separation plate and the sample stage.

19. The plasma processing method according to claim 18, wherein the sample is not placed on the sample stage during the cleaning.

20. A plasma processing method, comprising:

an adsorption step of forming a reaction layer on an etching target film by plasma generated using a reactive gas; and a desorption step of removing the reaction layer by using a rare gas in a metastable state generated by plasma, wherein the adsorption step and the desorption step are repeated, a pressure in the adsorption step is higher than a pressure in the desorption step, and a temperature of a sample stage on which a sample having the etching target film is placed in the adsorption step is the same as a temperature of the sample stage in the desorption step.

* * * * *